United States Patent [19]

Wu

[11] Patent Number: 6,087,677
[45] Date of Patent: Jul. 11, 2000

[54] HIGH DENSITY SELF-ALIGNED ANTIFUSE

[75] Inventor: Koucheng Wu, San Jose, Calif.

[73] Assignee: Integrated Silicon Solutions Inc., Santa Clara, Calif.

[21] Appl. No.: 08/966,877

[22] Filed: Nov. 10, 1997

[51] Int. Cl.[7] .............................. H01L 29/38; H01L 23/48
[52] U.S. Cl. ........................... 257/50; 257/530; 257/764; 438/33; 438/67; 438/48
[58] Field of Search ..................... 257/52, 530; 437/170, 437/40; 338/195; 427/122

[56] References Cited

U.S. PATENT DOCUMENTS

| | | | |
|---|---|---|---|
| 3,873,383 | 3/1975 | Kooi ........................................ | 148/187 |
| 4,576,538 | 10/1985 | Suzuki ..................................... | 29/576 |
| 4,837,178 | 6/1989 | Ohshima et al. ......................... | 437/33 |
| 5,578,836 | 11/1996 | Husher et al. ............................ | 257/50 |
| 5,763,898 | 6/1998 | Forouhi et al. .......................... | 257/50 |

OTHER PUBLICATIONS

K.E. Gordon, et al., "Conducting Filament of the Programmed Metal Electrode Amorphous Silicon Antifuse," 0–7803–1450–6 (1993) IEEE, IEDM 93–27, pp. 2.6.1–2.6.4.

L. Geppert, Sr. Associate Editor, "Solid State," IEEE Spectrum (Jan. 1997), pp. 55–59.

Primary Examiner—Donald L. Monin, Jr.
Assistant Examiner—Dwayne L. Bentley
Attorney, Agent, or Firm—Pennie & Edmonds, LLP

[57] ABSTRACT

The present invention is an antifuse structure comprising an insulation layer between a top conductor and a bottom conductor. The insulation layer has a via. A resistive layer is adjacent the via and a plug is adjacent the resistive layer. The plug is in the via and is also adjacent the top conductor.

The present invention also provides a method for fabricating the antifuse on a base. A bottom conductor is deposited on the base. An insulation layer are deposited adjacent the bottom conductor. An antifuse via is etched into the insulation layer. A resistive layer is deposited in the antifuse via. A plug is deposited. The plug extends into the antifuse via. A top conductor is deposited and patterned adjacent the plug.

9 Claims, 6 Drawing Sheets

HIGH DENSITY SELF-ALIGNED ANTIFUSE

The present invention relates generally to fabricating semiconductor integrated circuit antifuses and an antifuse structure, and more particularly to a method and structure for a self-aligned antifuse.

BACKGROUND OF THE INVENTION

A fuse is a device which provides an electrical connection, i.e. a short circuit. Initially, a fuse connects devices, i.e., is "on." If a certain voltage or current is applied to the fuse, the fuse will open and no longer provide a connection. The open fuse is considered to be "off." In contrast, an antifuse is a device which initially does not provide a connection and is "off." After a certain voltage or current is applied to an antifuse, the antifuse provides an electrical connection and is considered to be "on." In other words, the antifuse is programmed.

For example, field programmable gate arrays (FPGAs) and programmable read-only memories (PROMs) are semiconductor integrated circuits which use fuse and antifuse structures. Typically, a PROM comprises an array of memory cells arranged in rows and columns which can be programmed to store user data. FPGAs have a large number of logic elements, such as AND gates and OR gates, which can be selectively coupled together, i.e., programmed, by means of fuses or antifuses to perform user designed functions. An unprogrammed fuse-type gate array is programmed by selectively blowing or opening fuses within the gate array. In contrast, an unprogrammed antifuse type gate array is programmed by causing selected antifuses to become conductive.

FIG. 1 is a schematic diagram of an antifuse structure 100. The antifuse has a bottom electrode 101 and a top electrode 103. The bottom electrode 101 is commonly referred to as "metal 1" and the top electrode 103 is commonly referred to as "metal 2." The bottom and top electrodes 101, 103 comprise conductive materials such as metal, polysilicon or a doped semiconductor. Typically, the conductive material comprises aluminum (Al). In some embodiments, the bottom and top electrodes 101, 103 have their own substructure comprising layers of different materials. For example, the top electrode 103 may comprise a layer of titanium nitride (TiN), a layer of tungsten (W), a layer of aluminum (Al), and another layer of titanium nitride (TiN). The layers of TiN act as barriers to prevent diffusion of the Al into the oxide layers. An intermediate layer 105 is between the top electrode 103 and the bottom electrode 101. The intermediate layer 105 comprises a material which initially has a high resistance but can be converted into low resistance by applying a programming voltage. For example, the intermediate layer 105 can be either silicon dioxide ($SiO_2$) or amorphous silicon ($\alpha$-Si). After programming, a conductive path, called a via link, connects the bottom electrode 101 to the top electrode 103.

Types of Antifuse Structures

Two different types of antifuse structures are widely used in the industry: (1) metal-$\alpha$-Si-metal (amorphous silicon or $\alpha$-Si) structures and (2) polysilicon-oxide-diffusion (oxide) structures. During programming, the conductive path for each type of antifuse structure forms in a different manner. In the $\alpha$-Si antifuse structure, the resistivity of the intrinsic $\alpha$-Si is about 10M ohm-cm. A programming voltage is applied across the electrodes of the antifuse structure which creates an electric field. When the programming voltage exceeds the breakdown voltage of the $\alpha$-Si, the high electric field causes metal ions to migrate into the $\alpha$-Si region and creates a filament of polycrystalline suicide. The filament forms the conductive path between the top and bottom electrodes. For example, in practice, the $\alpha$-Si layer is about 800–1,000 Å thick, and the programming voltage is about 12V for about 20 milliseconds.

To program the oxide antifuse structure, a high programming voltage is applied to the electrodes to ensure oxide breakdown because the breakdown field in oxide is higher than that in $\alpha$-Si. Due to the resulting high current flow, a conductive path between the top and bottom electrodes is created in the oxide layer by defects and impurity migration.

However, oxide antifuse structures have several disadvantages. First, since the oxide breakdown field is high, the oxide thickness needs to be very thin (<100 Å) to have a reasonable value of the programming voltage (below 15V). Second, because the programming voltage is highly dependent on the thickness of the oxide layer, the oxide thickness needs to be well controlled to have a uniform programming voltage. Third, the "on" resistance of the oxide antifuse, e.g., about 400 ohms, is greater than the "on" resistance of the $\alpha$-Si antifuse, e.g., about 20 ohms.

Types of $\alpha$-Si Antifuse Structures

Three (3) types of $\alpha$-Si antifuse structures will now be described. FIG. 2 shows a first type of antifuse structure 200. The antifuse structure 200 has a bottom electrode or metal 1 layer 201 and a top electrode or metal 2 layer 203. An insulation layer 205, typically an inter-metal-oxide (IMO) layer, is between the bottom electrode 201 and top electrode 203. A middle metal layer 207 or metal 1.5 layer is between the top and bottom electrodes 201, 203. The IMO layer 205 also extends between the bottom electrode 201 and the middle metal layer 207. An $\alpha$-Si layer 209 is between the middle metal layer 207 and the top electrode 203. In the IMO layer 205 above the $\alpha$-Si layer 209 is a via. The top electrode 203 is adjacent the $\alpha$-Si layer 209 in the via.

However, this first type of antifuse structure 200 has several disadvantages. First, the antifuse structure 200 is not compatible with the standard silicon process. The process to form this structure requires two (2) additional masking steps to define the middle metal layer 207 and the $\alpha$-Si layer 209. Second, during programming, the electric field is not uniformly distributed in the $\alpha$-Si layer 209. The electric field at the bottom corners 211 of the top electrode 203 in the via is greater than the electric field in the middle of the via. The nonuniformly distributed electric field causes variation of the programming voltage. Third, after programming, the conductive path is very narrow, e.g., about 700Å in diameter, and always located at a corner 211 of the via. Fourth, to accommodate for misalignment, the size of the antifuse structure is much larger than the via.

FIG. 3 shows a second type of $\alpha$-Si antifuse structure 300. The second type of antifuse structure 300 has a bottom electrode 301 or metal 1 layer, and a top electrode 303 or metal 2 layer. An IMO layer 305 is between the bottom electrode 301 and top electrode 303. An $\alpha$-Si layer 307 is deposited on top of the bottom electrode 301. A conductive layer 309 is deposited on top of the $\alpha$-Si layer 307. For example, the conductive layer 309 comprises TiN or TiW. The conductive layer 309 acts as an etch stopper to prevent variation of the $\alpha$-Si layer 307 during the via etch step. The IMO layer 305 has a channel or via above the conductive layer 309. The top electrode 303 extends into and fills the via.

This second type of $\alpha$-Si antifuse structure 300 has some advantages over the first type of $\alpha$-Si antifuse structure 200. First, during programming, the electric field is more uniformly distributed than the electric field of the first type of α-Si antifuse structure. The planar structure of the top electrode 303 into the via does not have the sharp corners which cause a nonuniform electric field. Second, the process to make the second type of α-Si antifuse 300 is less complex than the process to make the first type of α-Si antifuse 200. For the second type of antifuse structure 300, one masking step is used to define the conductive layer 309 and the α-Si layer 307.

However, the process to make the second type of α-Si antifuse 300 has some disadvantages. The structure requires a special etch technique to etch the conductive layer 309, and α-Si layer 307, but not etch the bottom electrode 301. In addition, to accommodate for misalignment, the size of the antifuse structure is much larger than the via.

FIG. 4 shows a third type of α-Si antifuse structure 400 used by "QuickLogic." The third type of antifuse structure 400 has a bottom electrode 401 or metal 1 layer, a top electrode 403 or metal 2 layer, and an insulation layer 405. The insulation layer 405, i.e. IMO layer, is adjacent the bottom electrode 401. A tungsten plug 407 is in the insulation layer 405 and adjacent the bottom electrode 401. The tungsten plug 407 also functions as part of the bottom electrode 401. An α-Si layer 409 is adjacent a portion of the insulation layer 405, the tungsten plug 407 and the top electrode 403. This structure 400 is similar to an upside-down version of the first structure 200. During fabrication of the third type of antifuse structure 400, after depositing the tungsten plug 407, a chemical-mechanical-polish (CMP) process is used to ensure a flat surface before the α-Si layer 409 deposition. CMP is a planarization technique which improves global planarity, step coverage, interconnect speed and process windows. CMP is gaining wide acceptance in the fabrication of deep sub-micron technologies.

This third type of α-Si antifuse 400 also has some disadvantages. First, during programming, the electric field is not uniformly distributed at the corners of the tungsten plug 407. Second, to adjust for misalignment, the size of the α-Si layer 409 is much larger than the via size. However, the third structure 400 requires only one masking step to pattern the α-Si layer 409.

As device sizes continue to decrease while chip density increases, there is a need to decrease the size of antifuse structures. In all the above processes, the α-Si antifuse mask needs to align to the bottom electrode. The top electrode also needs to align to the α-Si antifuse mask. Therefore, the antifuse device sizes are relatively large to accommodate for the misalignment between the α-Si layer and the bottom and top electrodes. What is needed is a method and structure for a self-aligning antifuse to allow for reduction of antifuse size. The present invention discloses such methods and structures.

SUMMARY OF THE INVENTION

In summary, the present invention is an antifuse structure comprising an insulation layer between a top conductor and a bottom conductor. The insulation layer has a via. A resistive layer is adjacent the via and a plug is adjacent the resistive layer. The plug is in the via and is also adjacent the top conductor.

The present invention also provides a method for fabricating the antifuse of the preferred embodiment of the present invention. A bottom conductor is deposited on a base. An insulation layer is deposited adjacent the bottom conductor. An antifuse via is etched into the insulation layer. A resistive layer is deposited in the antifuse via. A plug is deposited. The plug extends into the antifuse via. A top conductor is deposited and patterned adjacent the plug.

In another embodiment, a regular via is etched through a portion of the resistive layer and the insulation layer to the bottom conductor. Alternatively, both the antifuse via and a regular via are etched during the same etching step.

Preferably, the resistive layer comprises amorphous silicon, the plug comprises tungsten, and the top and bottom conductors comprise aluminum.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
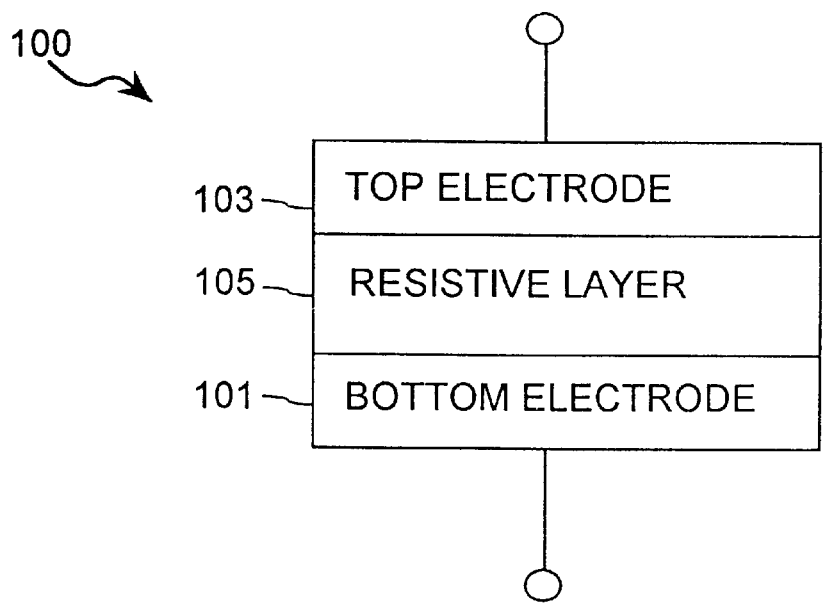
FIG. 1 is a schematic diagram of an antifuse structure.
Figure 2:
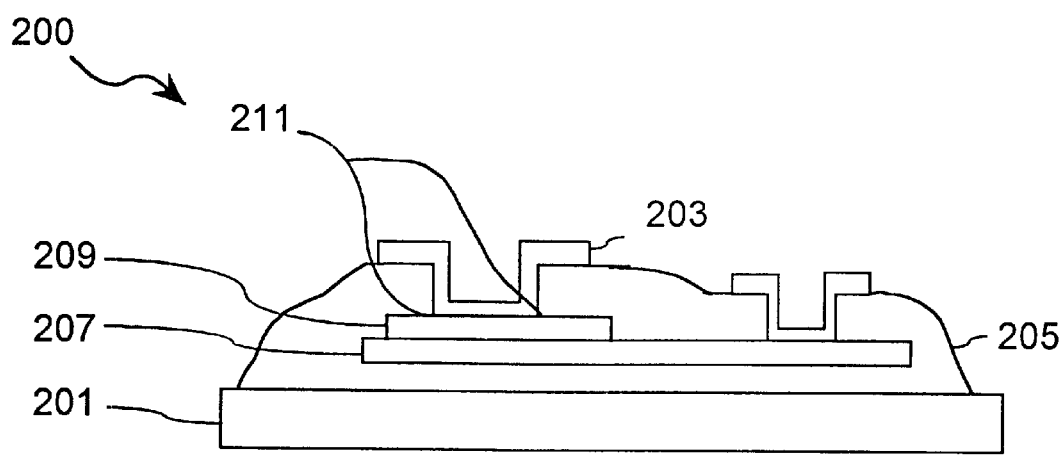
FIG. 2 is a cross-section of a first type of antifuse structure of the prior art.
Figure 3:
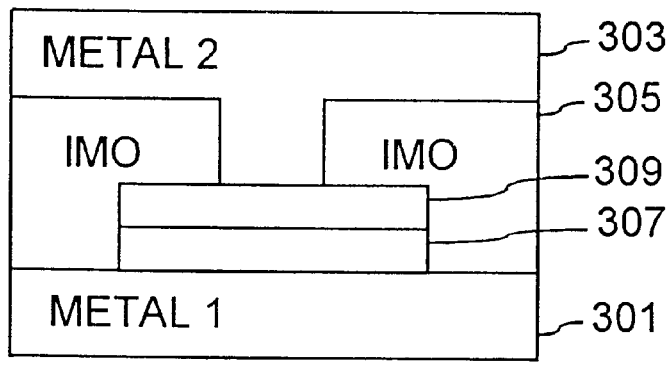
FIG. 3 is a cross-section of a second type of antifuse structure of the prior art.
Figure 4:
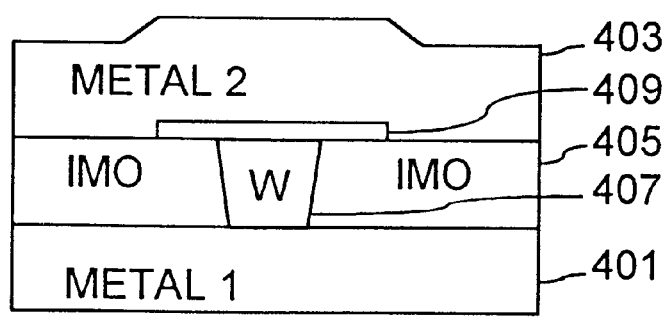
FIG. 4 is a cross-section of a third type of antifuse structure of the prior art.
Figure 5:
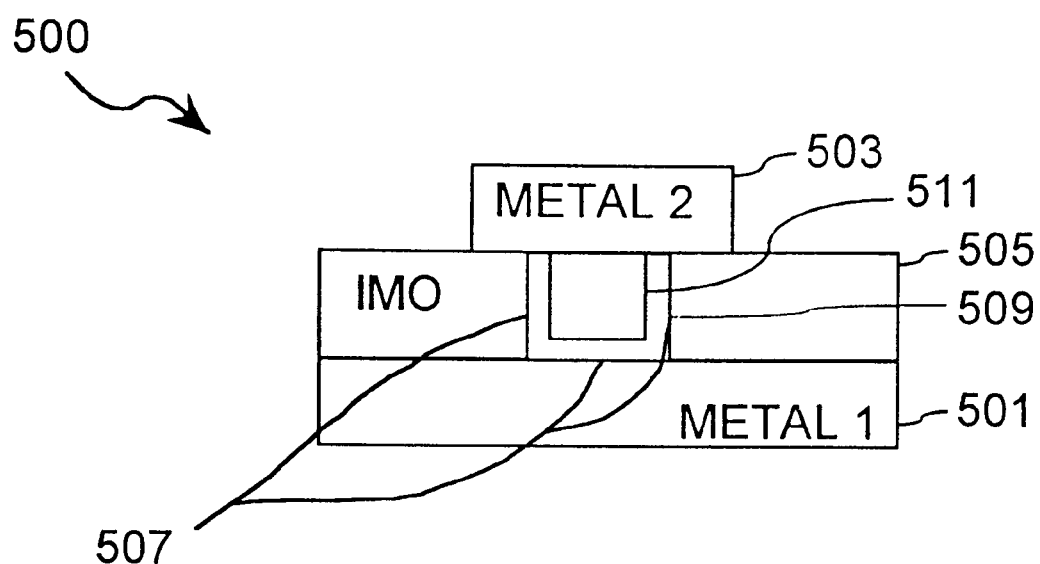
FIG. 5 is a cross-section of the high-density self-aligned antifuse of the preferred embodiment of the present invention.

FIG. 5 is a cross-section of the high-density self-aligned antifuse of the preferred embodiment of the present invention 500. The antifuse structure of the preferred embodiment of the present invention 500 has a bottom electrode 501 or metal 1 layer, and a top electrode 503 or metal 2 layer. The bottom and top electrodes 501, 503 comprise conductive materials such as metal, polysilicon or a diffused semiconductor. Preferably, the conductive material comprises aluminum (Al). Alternatively, the top and bottom electrodes have their own substructure comprising layers of different materials. For example, an electrode may comprise a sequence of layers of (listed from top to bottom) such as TiN/Al/TiN/Ti or TiW/Al/TiW.

An insulation layer 505 is between the bottom electrode 501 and top electrode 503. Preferably, the insulation layer 505 comprises an inter-metal oxide such as $SiO_2$ or boron phosphorous silicate glass (BPSG). The insulation layer 505 has a via 507. Preferably and ideally, the via 507 has a substantially rectangular shape. However, other via shapes may be used. For example, in practice, the via 507 may not be rectangular but be a trapezoid having a narrow bottom with sloping sidewalls leading to a wider top.

A resistive layer 509 comprises a material having a high initial resistance but which can be converted to a low resistance by applying a programming voltage may also be used is within the via. Preferably, the resistive layer 509 is conformal within the via adjacent the via bottom and sidewalls. Conformal means that the resistive layer 509 has substantially the same thickness on the bottom and side walls of the via. Even the deposition of the resistive layer 509 is not ideally conformal. For example, the sidewall thickness is different from the bottom thickness. However, the thickness variation on the sidewall is not critical because the electric field from the top electrode 503 to the bottom electrode 501 is through the bottom resistive layer, not through the sidewall resistive layer. The resistive layer can comprise α-Si, $SiO_2$ or silicon nitride (SiN). Preferably, the resistive layer 509 comprises α-Si and is about 800 Å thick for a 12V programming voltage. However, the present invention is not limited to an 800 Å α-Si layer or a 12V programming voltage. Both the thickness of the resistive layer 509 and programming voltage can be changed. Even with a conformal thickness, the resistive layer 509 will be thicker at the bottom corners because of the angle, e.g. 90° for a rectangular via. The thicker resistive layer at the corners cancels out the higher electric field at the corner of the tungsten plug and result in a more uniformly distributed electric field. After programming, the uniformly distributed electric field helps to create a wider conductive path in the resistive layer and thereby reduce the "on" resistance.

Within the via adjacent the resistive layer 509 is a plug 511. The plug 511 preferably comprises W. The top electrode 503 is adjacent the via 507. Because the resistive layer 509 is inside the via 507, the antifuse structure can be made very small.

Fabrication of the Antifuse Structure

Figure 6A:
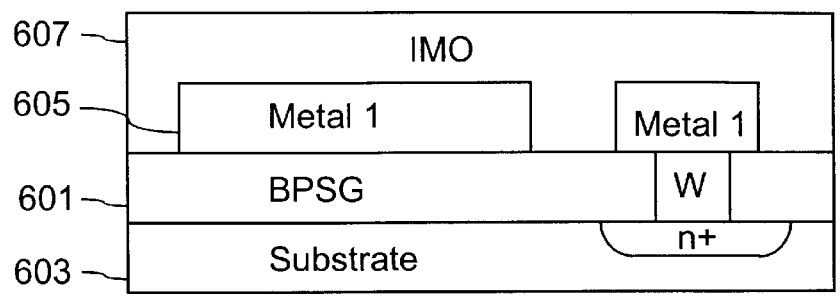
FIG. 6a shows an exemplary starting structure in a preferred method to fabricate the high-density self-aligned antifuse structure of the present invention.

FIGS. 6a–6g show a preferable method to build the antifuse structure of the present invention. FIG. 6a shows an exemplary starting structure for building the antifuse. An interlayer dielectric (ILD) 601 such as boron phosphorous silicate glass (BPSG) layer is formed on a substrate 603. A bottom electrode 605 or metal 1 layer is formed on the ILD layer 601. An insulation layer 607, preferably of an IMO such as $SiO_2$, is then provided to insulate the bottom electrode 605 from a top electrode or metal 2 (shown later).

Figure 6B:
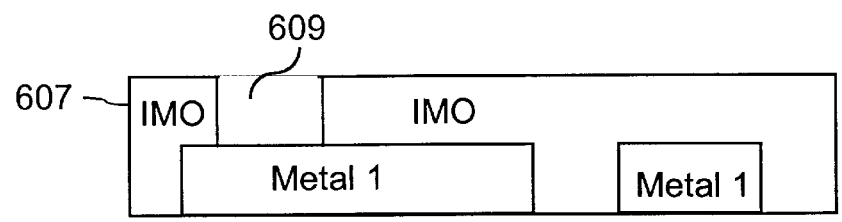
FIG. 6b shows the antifuse via etch step in the method of the present invention.
Figure 6C:
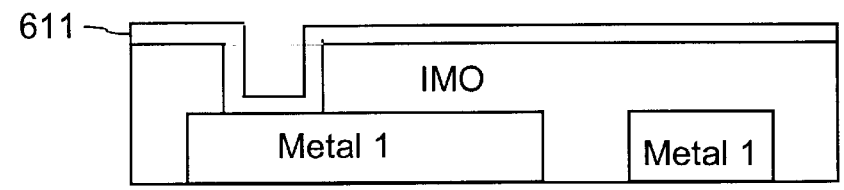
FIG. 6c shows the deposition of the resistive layer in the method of the present invention.
Figure 6D:
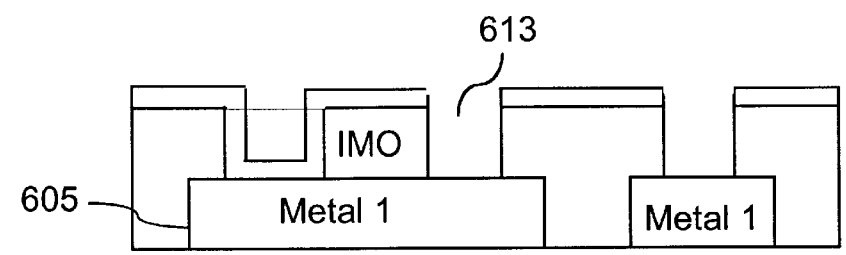
FIG. 6d shows a regular via etch step in the method of the present invention.
Figure 6E:
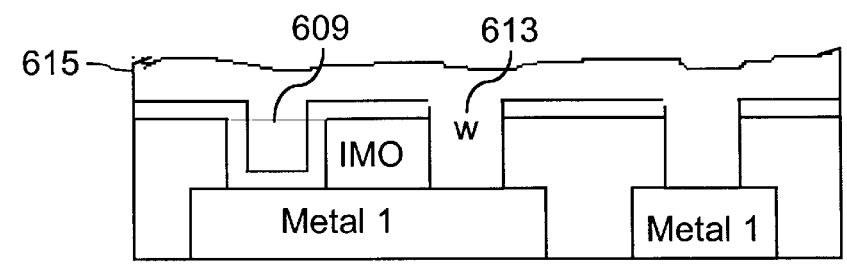
FIG. 6e shows the deposition of a plug material to fill the vias in the method of the present invention.
Figure 6F:
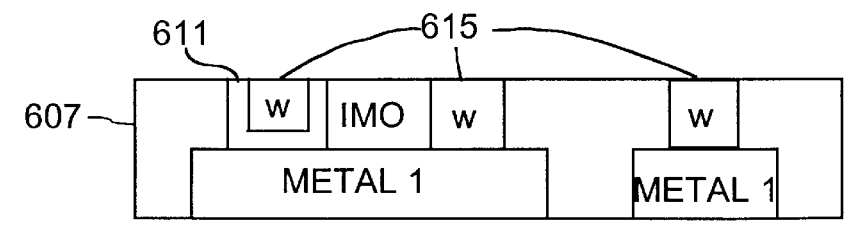
FIG. 6f shows the removal of excess plug material and a portion of the resistive layer in the method of the present invention.
Figure 6G:
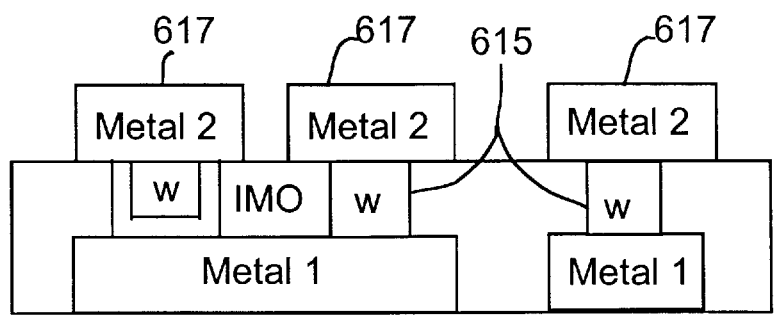
FIG. 6g shows the deposition and patterning of the top electrode in the method of the present invention.

In FIG. 6b, the method of the present invention starts when the antifuse via 609 is etched into the insulation layer 607. The insulation layer 607 is relatively thick, about 2 μm, because a CMP process step will be performed later. In FIG. 6c, a resistive layer 611, preferably a thin layer of α-Si, is deposited by a chemical vapor deposition (CVD) process, such as plasma enhanced chemical vapor deposition (PECVD) or low pressure chemical vapor deposition (LPCVD), to achieve conformal step coverage. In FIG. 6d, a regular, i.e. non-antifuse, via etch is performed to the bottom electrode 605 to form a regular via 613. A regular via is used to connect the bottom electrode or metal 1 layer 615 to a top electrode or the metal 2 layer (shown below). In FIG. 6e, both the antifuse via 609 and regular via 613 are filled with a plug material 615, preferably of tungsten (W), by a CVD process. In FIG. 6f, the excess plug material 615 and resistive layer 611 above the insulation layer 607 are removed by a chemical-mechanical polish (CMP) process. The CMP process consumes part of the insulation layer 607. In FIG. 6g, the top electrode 617 or metal 2 layer is deposited and patterned.

Figure 7A:
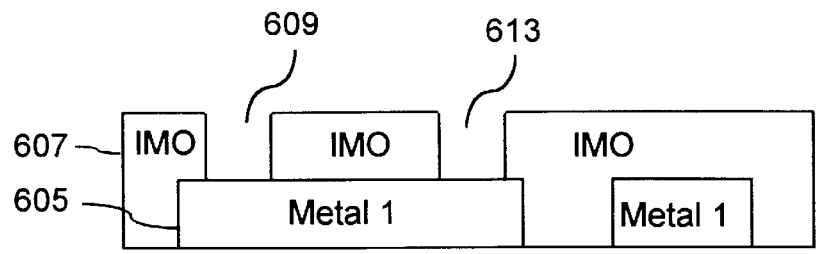
FIG. 7a shows an antifuse via etch step in an alternative method to fabricate the high-density self-aligned antifuse structure of the present invention.
Figure 7B:
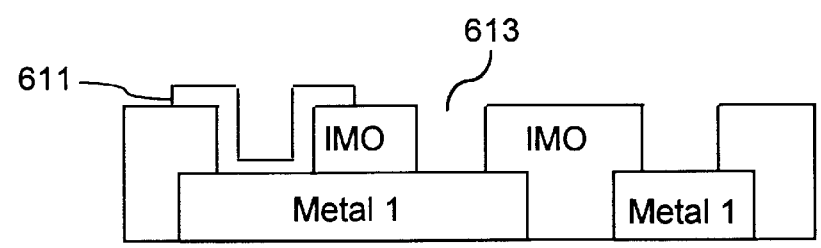
FIG. 7b shows the deposition of a resistive layer in the alternative method of the present invention.
Figure 7C:
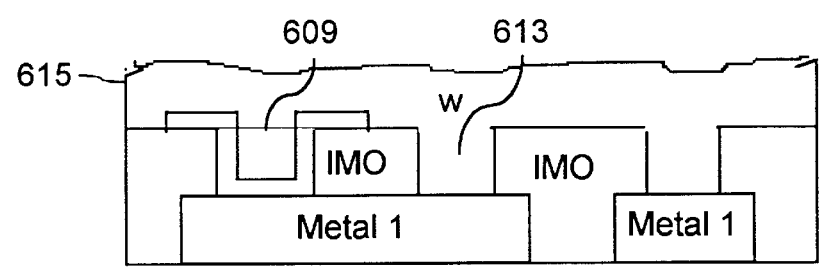
FIG. 7c shows the deposition of plug material to fill the vias of the alternative method of the present invention.
Figure 7D:
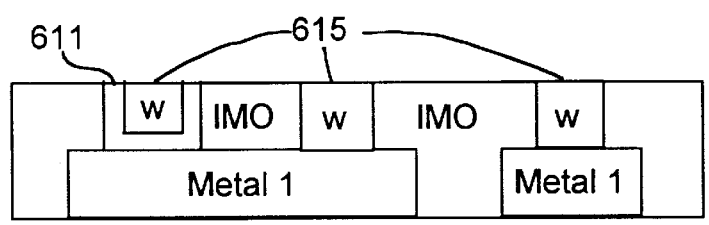
FIG. 7d shows the removal of excess plug material and a portion of the resistive layer in the alternative method of the present invention.
Figure 7E:
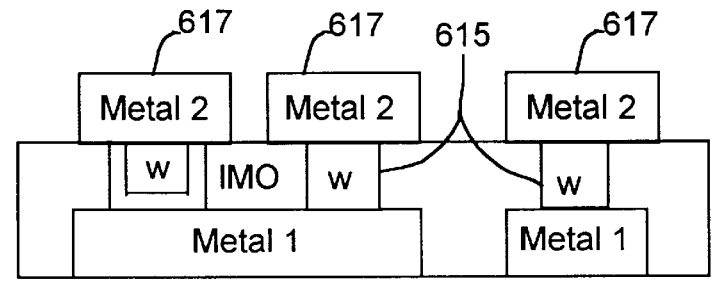
FIG. 7e shows the deposition and patterning of the top electrode in the alternative method of the present invention.

FIGS. 7a–7e show an alternative method to fabricate the antifuse of the present invention. FIGS. 7a–7e will use the same reference numerals as in FIGS. 6a–6g to denote similar structures. In FIG. 7a, the process starts with a via etch of the insulation layer 607 to provide an antifuse via 609 and a regular via 613 above a bottom electrode 605 or metal 1 layer. In FIG. 7b, a thin layer of resistive material 611, preferably of α-Si, is deposited and patterned. The resistive material covering the regular via 613 is removed. In FIG. 7c, a plug 615, preferably of tungsten, is deposited using CVD to fill both vias 609, 613. In FIG. 7d, the CMP process is used to remove the excess plug material 615 and resistive layer 611 and to planarize the surface. In FIG. 7e, a top electrode 617 or metal 2 layer is deposited and patterned.

Programming the Antifuse

The antifuse of the present invention can be programmed using existing techniques. Preferably, the antifuse uses a 12V programming voltage.

In summation, because both the resistive material and plug are in the same via, the resistive layer is self-aligned to the plug. The size of the antifuse is determined by the size of the via. However, the design rules of metal 1 and metal 2 extensions beyond the via still apply. Although the antifuse via may be slightly larger than a regular via to accommodate the resistive layer on the walls, the overall antifuse structure of the present invention is very small and suitable for large-scale FPGA applications.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. An antifuse structure comprising:

an insulation layer between a top conductor and a bottom conductor, the insulation layer having a via disposed over the bottom conductor, the via having a bottom and sides that connect at corners, a resistive layer adjacent the bottom and sides of the via, the resistive layer having sidewalls adjacent the sides of the via, the sidewalls having a top end, a plug adjacent the resistive layer, the resistive layer and the plug being in the via, the plug also being adjacent the top conductor, the top end of the sidewalls, one end of the plug, and the insulation layer forming a planarized surface, the one end of the plug contacting the top conductor, the resistive layer being thicker at the corners, such that a substantially uniform electric field is applied across the resistive layer adjacent the bottom conductor during programming.

2. The antifuse structure of claim 1 wherein the sidewalls of the via are substantially perpendicular to the bottom of the via.

3. The antifuse structure of claim 2 wherein the resistive layer has substantially the same thickness on the bottom and sidewalls of the via.

4. The antifuse structure of claim 1 wherein the resistive layer comprises a material having a high initial resistance but which can be converted to a low resistance by applying a programming voltage.

5. The antifuse structure of claim 4 wherein the resistive layer comprises amorphous silicon.

6. The antifuse structure of claim 1 wherein the top conductor comprises metal, polysilicon, or diffused semiconductor.

7. The antifuse structure of claim 5 wherein the bottom conductor comprises metal, polysilicon, or diffused semiconductor.

8. The antifuse structure of claim 1 wherein the plug comprises tungsten.

9. The antifuse structure of claim 1 wherein the via is substantially rectangular.

* * * * *